US005642363A

United States Patent [19]

Smith

[11] Patent Number: 5,642,363

[45] Date of Patent: Jun. 24, 1997

[54] METHOD AND APPARATUS FOR TESTING OF ELECTRONIC ASSEMBLIES

[75] Inventor: Gregory James Smith, San Diego, Calif.

[73] Assignee: NCR Corporation, Dayton, Ohio

[21] Appl. No.: 576,530

[22] Filed: Dec. 21, 1995

[51] Int. Cl.⁶ .................................................. G01R 31/28
[52] U.S. Cl. ........................................................ 371/22.3
[58] Field of Search .............................. 371/22.3, 22.2, 371/22.5, 22.6, 20.1; 365/201; 324/73.1, 76.11, 158.1; 327/297

[56] References Cited

U.S. PATENT DOCUMENTS

| | | | |
|---|---|---|---|
| 4,868,414 | 9/1989 | Kanazawa | 307/244 |
| 4,876,501 | 10/1989 | Ardini et al. | 324/73 R |
| 4,914,379 | 4/1990 | Maeno | 371/22.3 |
| 5,054,024 | 10/1991 | Whetsel | 371/22.3 |

OTHER PUBLICATIONS

IEEE Standard Test Access Port and Boundary-Scan Architechture (IEEE Std. 1149.1–1990) Pub. by Institute of Electrical & Electronic Engineers, New York (May 1990).

*Primary Examiner*—Hoa T. Nguyen
*Attorney, Agent, or Firm*—George H. Gates

[57] ABSTRACT

A testing method and apparatus for testing complex board assemblies by configuring the data paths on the multiple boards into one larger virtual data path. The system uses reconfiguration commands and serial data streams to test the virtual data path, and reconfigures the virtual data path as sections are tested to shorten the virtual data path after each data stream is verified, thereby reducing test time and cost.

15 Claims, 3 Drawing Sheets

METHOD AND APPARATUS FOR TESTING OF ELECTRONIC ASSEMBLIES

BACKGROUND OF THE INVENTION

1. Field of the Invention

This invention relates in general to a testing system for electronic assemblies, and more particularly, to a system which can reconfigure test paths of the electronic assemblies during testing periods.

2. Description of Related Art

Electronic devices and assemblies have become more complex during the past decade. Because of this increase in complexity, testing of these electronic assemblies has become more costly and more time consuming. Typical test times for assemblies are often three to five times the assembly time for assemblies of average complexity, and for the most complex assemblies, such as computer mother boards, test times of up to ten times the assembly time are not uncommon. Because of this increased cost in testing and increased time to test an assembly, advanced products cost more for consumers. Intricate computer chips, such as central processing units (CPUs), are more costly for end users because of the testing that must take place prior to shipping a unit for consumer use. This cost is passed directly on to the consumer.

The electronics industry has, by necessity, found methods to make this testing less costly and less time consuming. Automatic test equipment (ATE) is now normally constructed for production lines to standardize the tests for each device or assembly. ATE is also used to simulate actual conditions for the assembly, and can exercise the functions of the assembly under controlled conditions. Self-test features are also built-in to some devices, in order to give the user confidence that the electronics are working properly prior to actual use.

The ATE and self-test methods use the devices in the configurations that they will be used in their intended applications. This process may take several minutes or hours, depending on all of the functions that a self-test or ATE must test on the device before allowing the device to continue on to the next assembly level. If the testing is to be performed on a completed assembly or unit, the test can take several hours before a passable rating can be obtained, because of all of the functions and data paths that must be exercised.

These testing methods and testing machines are still rather costly and time consuming. These testing costs are still a significant percentage of the cost of the device to the manufacturer, as well as the consumer.

As electronics becomes more modularized and computer controlled, the electronics is divided by function and placed on printed circuit boards. The boards are designed to fit into a chassis or "card cage" that provides standardized inputs and outputs from each board. The chassis sometimes contains a backplane that is used for standardization of power and ground as well as data paths between board assemblies.

One skilled in the art will recognize that testing assemblies that are connected via a backplane is even more complicated than testing of individual modules. This complexity sometimes comes from the use of the backplane during the testing process, since the backplane can introduce timing errors, misconnections, and signal delays. Backplane testing is even more time consuming and expensive than assembly or device testing because the test must be "designed" by the test engineer. Further, the test is usually automated, requiring the engineer to write software programs and procedures to test the hardware connected to the backplane.

Because the hardware is usually designed to perform one specific purpose, the hardware cannot be reconfigured during a test to make the test easier or require less time to perform. This additional consideration makes testing of backplane connected assemblies more difficult, since the test engineer cannot design his test around his testing needs, but must design his test around the assemblies and backplane limitations. Because of this limitation, testing time is increased, and the cost of the end product to the consumer is higher.

It can be seen then that there is a need for a method of testing electronic devices and assemblies that is less costly. It can also be seen that there is a need for a method of testing electronic devices and assemblies that is less time consuming.

SUMMARY OF THE INVENTION

To overcome the limitations in the prior art described above, and to overcome other limitations that will become apparent upon reading and understanding the present specification, the present invention discloses a powerful and highly productive system and method for testing electronic assemblies.

The present invention solves the above-described problems by providing each assembly with a Master Test Access Point (TAP) that is controlled by an application specific integrated circuit (ASIC). The Master TAP ASIC controls the testing of the board. In addition, a Scan Control ASIC can dynamically configure the electronic paths, or scan paths, that are to be tested. By properly connecting the outputs of the Master TAP ASIC to a switchable input of the Scan Control ASIC, the scan path can be dynamically reconfigured during the test to shorten test time. Further, the Master TAP output of one board assembly can be dynamically connected to the Master TAP input of another board assembly, which allows the board assemblies to look like one larger board assembly, or "virtual board assembly."

A system in accordance with the principles of the present invention comprises a diagnostic controller which generates the commands to be sent to the assembly, receives data from the assembly, and compares that data with expected values; a board assembly with a Master TAP ASIC and a Scan Control ASIC; interconnecting hardware for connecting the boards to the diagnostic controller; and a connecting backplane to connect the boards to each other.

One object of the present invention is to reduce test time for electronic assemblies. Another object of the present invention is to reduce the cost of testing electronic assemblies.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method of testing electronic assemblies that reduces test time and costs by dynamically reconfiguring the assemblies to be tested in order to remove portions of the circuitry after testing has been completed. First, all of the assemblies or boards are configured into one virtual board assembly, such that each board "thinks" that it is not a separate board but part of a larger module. This allows instructions from the diagnostic processor to be sent to one virtual board and for each individual board assembly to talk to the others over connections that may not reflect the final configuration of the board assemblies.

This invention utilizes an Institute of Electrical and Electronic Engineers (IEEE) 1149.1 standard protocol as a preferred embodiment to perform these reconfigurations. One skilled in the art will recognize that the use of the IEEE 1149.1 standard is not necessary to perform the invention, and that other standard or non-standard interfaces and protocols could be used to perform the teachings of the invention.

Figure 1:
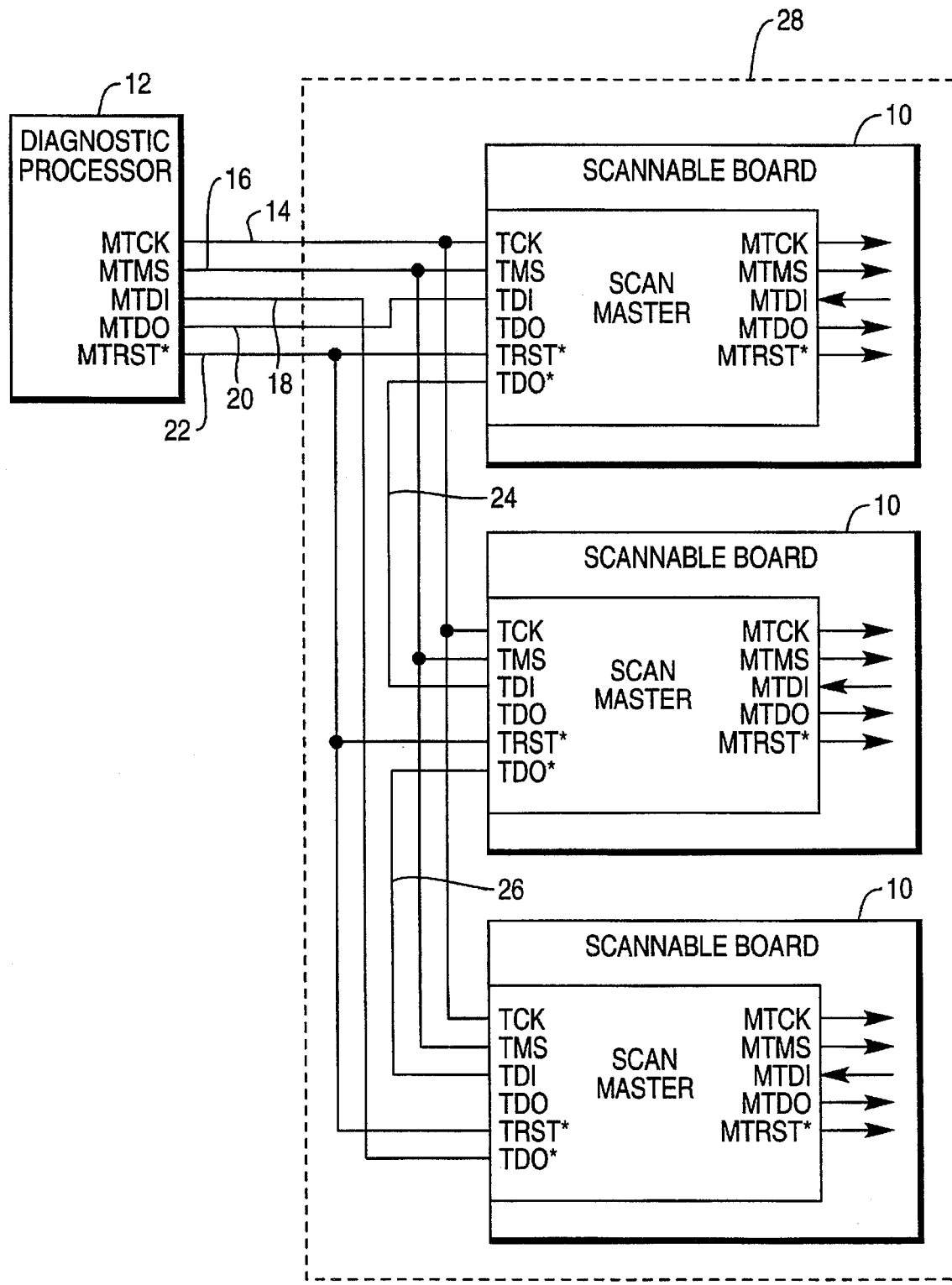
FIG. 1 is a block diagram of the testing configuration showing multiple assemblies to be tested.

FIG. 1 is a block diagram of the testing configuration showing multiple assemblies 10 to be tested. The diagnostic processor 12 is connected to the multiple assemblies 10 via a plurality of signal paths.

Signal path 14 connects the Master Test Clock (MTCK) of the diagnostic processor 12 to the test clock (TCK) of each of the assemblies 10. This allows the diagnostic processor 12 to control all of the assemblies 10 with the same clock reference.

Signal path 16 connects the Mater Test Mode Select (MTMS) of the diagnostic processor 12 to the test mode select (TMS) inputs of each of the assemblies 10. This allows the diagnostic processor 12 to set each of the assemblies 10 to either a test mode or operations mode.

Signal path 18 connects the Master Test Data Input (MTDI) of the diagnostic processor 12 to the test data output prime (TDO') of one of the assemblies 10.

Signal path 20 connects the Master Test Data Output (MTDO) of the diagnostic processor 12 to the test data input (TDI) of one of the assemblies 10.

Signal path 22 connects the Master Test Reset (MTRST*) of the diagnostic processor 12 to the test reset inputs (TRST*) of the assemblies 10.

Signal path 20 connecting the MTDO to one assemblies 10 TDI is continued on signal path 24 which connects TDO' of the first assembly 10 to TDI of the second assembly 10.

Similarly, signal path 26 continues the signal flow from the second assemblies' 10 TDO' to the third assemblies' 10 TDI. The path is completed back to the diagnostic processor 12 via signal path 22. This continuous path allows the assemblies 10 to be connected into a single, "virtual" assembly 28.

The virtual assembly 28 is now tested as a single assembly by the diagnostic processor 12, because the diagnostic processor 12 can reconfigure each of the individual assemblies 10 for testing as a virtual assembly 28, and then reconfigure the individual assemblies 10 to perform their original tasks prior to the end of the testing cycle. As the testing cycle progresses, the paths on the individual assemblies 10 are reconfigured to test each path used on the assembly 10, and then a shorter path on the assembly is used after a path is tested and passed.

Figure 2A:
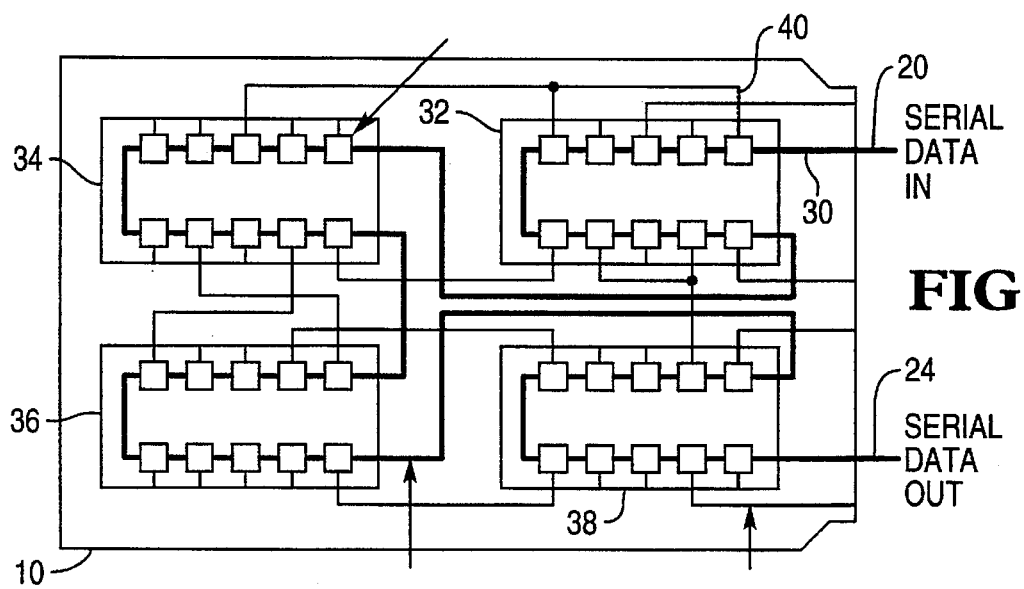
FIGS. 2A to 2C are block diagrams of one assembly to be tested.
Figure 2B:
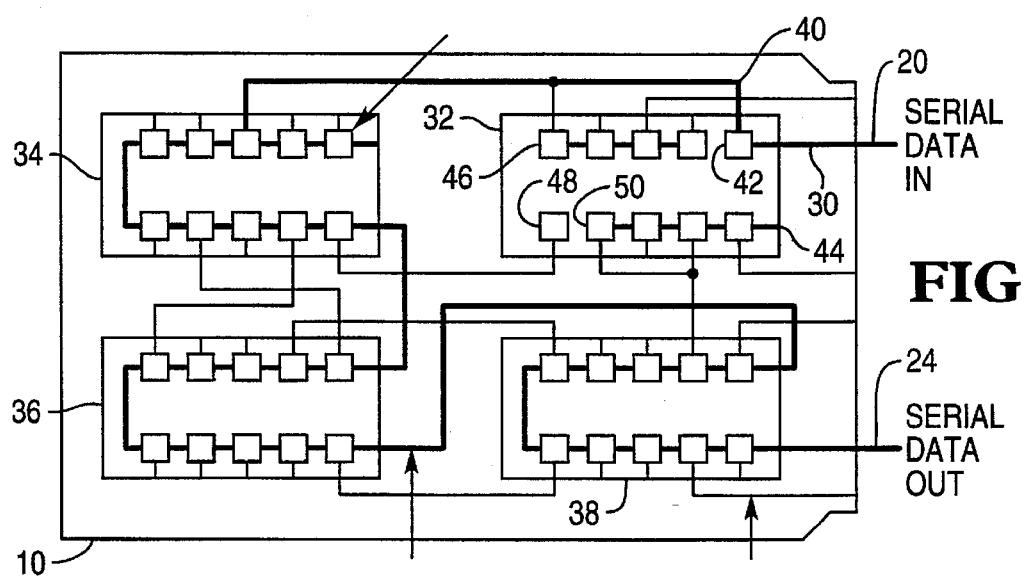
Figure 2C:
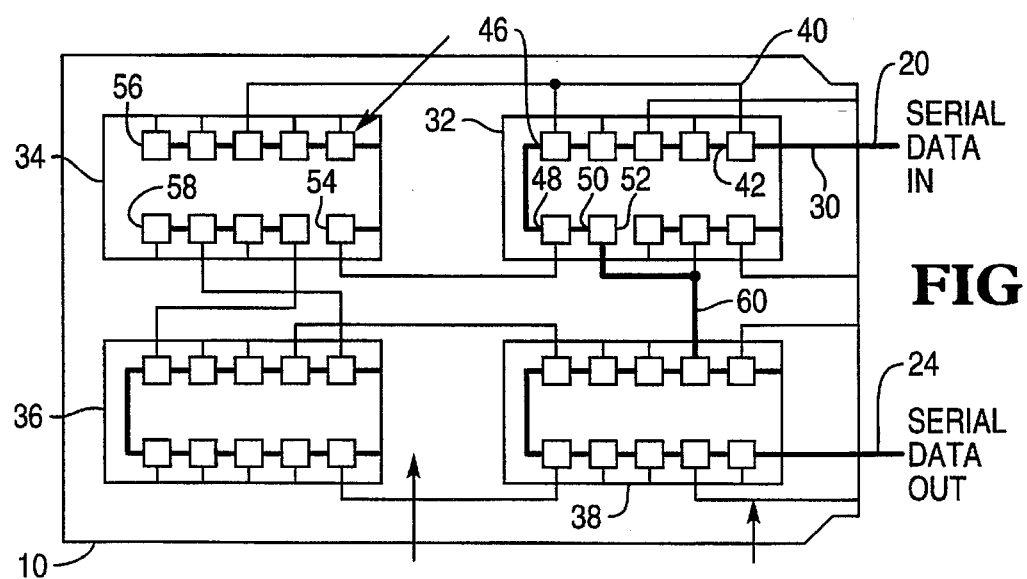

A further explanation of this feature is described in FIGS. 2A, 2B, and 2C.

FIG. 2A shows an assembly 10 which is configured to test path 30. Path 30 tests all of the subassemblies 32, 34, 36, and 38 on the assembly 10. Initially, path 30 traverses a path that serpentines through all of the assemblies 32, 34, 36, and 38 and all of the ports that receive data on each of the assemblies 32, 34, 36, and 38. However, path 40 is in parallel with path 30, and needs to be tested separately to ensure that the assembly 10 is functioning properly. Further, in order to speed up the testing process, removing subassembly 32 from the testing process as much as possible would decrease the time it takes to test the remainder of the subassemblies 34, 36, and 38 on assembly 10. Therefore, a reconfiguration of the assembly 10 would decrease testing time.

Referring now to FIG. 2B, once path 30 is tested and passes the test, path 30 is reconfigured by the diagnostic processor 12 (not shown on FIG. 2) to break the path 30 at nodes 42, 44, 46, 48, and 50. This reconfiguration removes subassembly 32 from the test path 30 as much as possible, and leaves subassemblies 34, 36, and 38 in the test path 30. However, now only path 40 connects subassembly 32 to subassembly 34, and is therefore tested alone in this configuration. This ensures that the testing will test paths in an orderly fashion, as well as testing the paths 40 a minimal number of times.

Referring now to FIG. 2C, after testing subassemblies 34 and 36 to their maximum extent, as well as all of the paths that connect to subassemblies 34 and 36, such as path 40, the assembly 10 can be reconfigured to minimize the path distance through the assembly 10. To accomplish this, nodes 42, 46, 48, and 50 are reconnected to path 30. Nodes 52, 54, 56, and 58 are disconnected from path 30. This now will have path 30 include path 60, which is the only connection between subassembly 32 and subassembly 38. This configuration completely bypasses subassemblies 34 and 36, thus saving test time.

Figure 3:
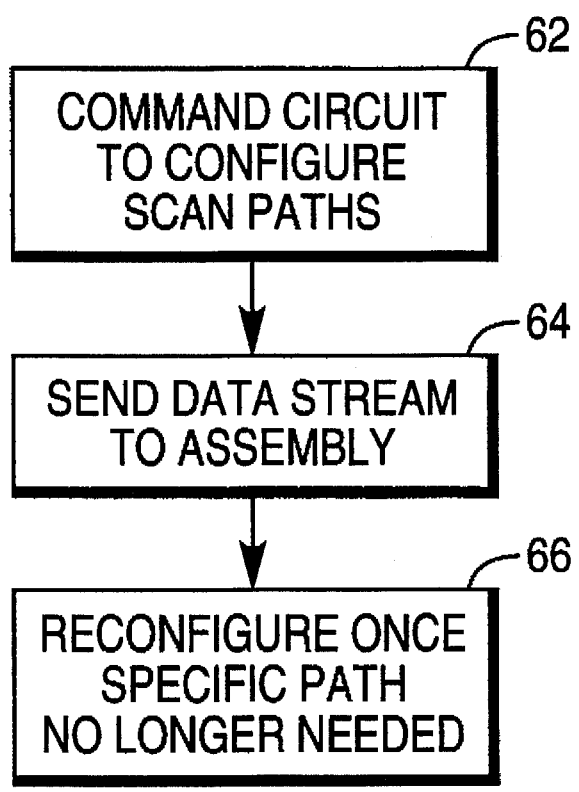
FIG. 3 is a flowchart showing the steps used to practice the present invention.

FIG. 3 is a flowchart showing the steps used to practice the present invention. Once the input of the test interface is connected to the diagnostic processor, and a master output of the test interface is connected to a switchable input of a circuit, step 62 represents the diagnostic processor 12 commanding the circuit to configure the scan paths on the electronic assembly 10 into one virtual scan path. Once this is done, step 64 represents the diagnostic processor 12 sending data to the electronic assembly 10. Finally, after the configuration that was configured in step 62 is completely tested, and some portion of the virtual scan path can be removed from the scan path for the remainder of the test, step 66 represents the diagnostic processor 12 reconfiguring the assembly 10 for the test to continue. This process repeats itself until all of the scan paths have been tested on the assembly 10.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of testing one or more electronic assemblies, comprising the steps of:
   (a) configuring a plurality of scan paths on a first electronic assembly into a first virtual scan path;
   (b) sending data to the first electronic assembly via the first virtual scan path;
   (c) reconfiguring the plurality of scan paths on the first electronic assembly into a second virtual scan path when a specific one of the scan paths is no longer needed, wherein the second virtual scan path does not contain the specific one of the scan paths; and
   (d) sending data to the first electronic assembly via the second virtual scan path.

2. The method of claim 1, further comprising a second electronic assembly connected in series with the first electronic assembly.

3. The method of claim 2, wherein:
   the configuring step comprises the step of configuring a plurality of scan paths on the first and second electronic assemblies into a first virtual scan path;
   the sending step comprises the step of sending data to the first and second electronic assemblies via the first virtual scan path;
   the reconfiguring step comprises the step of reconfiguring the plurality of scan paths on the first and second electronic assemblies into a second virtual scan path where one of the scan paths is excluded therefrom; and
   the sending step comprises the step of sending data to the first and second electronic assemblies via the second virtual scan path.

4. The method of claim 1, wherein the electronic assembly comprises a test interface, and the test interface is coupled to a diagnostic processor.

5. The method of claim 4, wherein the interface is an IEEE standard interface.

6. The method of claim 5, wherein sending steps both further comprise the step of sending data to the electronic assembly using an IEEE standard protocol.

7. An apparatus for testing one or more electronic assemblies, comprising:
   (a) a first electronic assembly having a Master Test Access Point (TAP) and a Scan Control circuit for dynamically configuring scan paths in the first electronic assembly that are to be tested; and
   (b) a testing circuit, coupled to the Master TAP and the Scan Control circuit of the first electronic assembly, for configuring the scan paths in the first electronic assembly to create a virtual scan path, for generating one or more sequences of test data for transmission to the first electronic assembly, and for dynamically reconfiguring the scan paths in the first electronic assembly between the sequences of test data to shorten a test time for the sequences.

8. The apparatus of claim 7, further comprising a second electronic assembly interconnected in series with the first electronic assembly.

9. The apparatus of claim 8, wherein the testing circuit is coupled to the Master Testing Access Points and the Scan Control circuits of the interconnected first and second electronic assemblies, the testing circuit further comprising means for configuring the scan paths in the interconnected first and second electronic assemblies to create the virtual scan path, for generating one or more sequences of test data for transmission to the interconnected first and second electronic assemblies, and for dynamically reconfiguring the scan paths in the interconnected first and second electronic assemblies between the sequences of test data to shorten a test time for the sequences.

10. The apparatus of claim 8, wherein sequence of test data comprises an IEEE standard protocol.

11. The apparatus of claim 7, wherein the Master Test Access Point is an IEEE standard interface.

12. A testing method and apparatus for testing a plurality of interconnected board assemblies, comprising the steps of:
   (a) transmitting a command from a test circuit to the interconnected board assemblies to configure a plurality of data paths on the interconnected board assemblies into a first virtual data path;
   (b) generating one or more first serial data streams to test the first virtual data path in the test circuit, and transmitting the first data stream from the test circuit to the interconnected board assemblies along the first virtual data path;
   (c) transmitting a command from the test circuit to the interconnected board assemblies to reconfigure the data paths on the interconnected board assemblies into a second virtual data path, wherein the second virtual data path is shorter than the first virtual data path; and
   (d) generating one or more second serial data streams to test the second virtual data path in the test circuit, and transmitting the second data stream from the test circuit to the interconnected board assemblies along the second virtual data path.

13. The method of claim 12, wherein each board assembly comprises a test interface, and the test interface is coupled to a diagnostic processor.

14. The method of claim 13, wherein the interface is an IEEE standard interface.

15. The method of claim 14, wherein generating steps both further comprise the step of generating the serial data streams using an IEEE standard protocol.

* * * * *